United States Patent
Brill

(10) Patent No.: US 9,904,993 B2
(45) Date of Patent: Feb. 27, 2018

(54) METHOD AND SYSTEM FOR OPTIMIZING OPTICAL INSPECTION OF PATTERNED STRUCTURES

(71) Applicant: NOVA MEASURING INSTRUMENTS LTD., Rehovot (IL)

(72) Inventor: Boaz Brill, Rehovot (IL)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 0 days.

(21) Appl. No.: 15/050,613

(22) Filed: Feb. 23, 2016

(65) Prior Publication Data
US 2016/0284077 A1    Sep. 29, 2016

Related U.S. Application Data

(63) Continuation of application No. 13/704,780, filed as application No. PCT/IL2011/000479 on Jun. 16, 2011, now abandoned.

(60) Provisional application No. 61/355,571, filed on Jun. 17, 2010.

(51) Int. Cl.
| | |
|---|---|
| G06K 9/00 | (2006.01) |
| G06T 7/00 | (2017.01) |
| G01B 21/02 | (2006.01) |
| G03F 7/20 | (2006.01) |
| G01B 11/02 | (2006.01) |
| G06T 7/80 | (2017.01) |

(52) U.S. Cl.
CPC ............ *G06T 7/0004* (2013.01); *G01B 11/02* (2013.01); *G01B 21/02* (2013.01); *G03F 7/70625* (2013.01); *G06T 7/80* (2017.01); *G01B 2210/56* (2013.01); *G06T 2207/30148* (2013.01)

(58) Field of Classification Search
None
See application file for complete search history.

(56) References Cited

U.S. PATENT DOCUMENTS

| | | | |
|---|---|---|---|
| 6,248,485 B1 * | 6/2001 | Cuthbert | G03F 7/70625 430/30 |
| 6,650,424 B2 | 11/2003 | Brill et al. | |
| 7,330,279 B2 | 2/2008 | Vuong et al. | |

(Continued)

FOREIGN PATENT DOCUMENTS

| | | |
|---|---|---|
| JP | 2004219343 A | 8/2004 |
| JP | 2008530579 | 8/2008 |

(Continued)

OTHER PUBLICATIONS

Gross et al "Mathematical modelling of indirect measurements in scatterometry" Science Direct. 39 : 782-794 (2006).

*Primary Examiner* — Sean Conner
(74) *Attorney, Agent, or Firm* — Browdy and Neimark, P.L.L.C.

(57) ABSTRACT

A system and method are presented for use in inspection of patterned structures. The system comprises: data input utility for receiving first type of data indicative of image data on at least a part of the patterned structure, and data processing and analyzing utility configured and operable for analyzing the image data, and determining a geometrical model for at least one feature of a pattern in said structure, and using said geometrical model for determining an optical model for second type of data indicative of optical measurements on a patterned structure.

17 Claims, 6 Drawing Sheets

(56) References Cited

U.S. PATENT DOCUMENTS

| | | |
|---|---|---|
| 7,751,046 B2 | 7/2010 | Levy et al. |
| 7,787,685 B2 | 8/2010 | Huang et al. |
| 8,196,068 B2 | 6/2012 | Zhang |
| 2002/0090744 A1* | 7/2002 | Brill ................. G01B 15/00 438/11 |
| 2004/0017574 A1* | 1/2004 | Vuong ................ G03F 7/705 356/625 |
| 2005/0012928 A1 | 1/2005 | Sezginer et al. |
| 2005/0100205 A1 | 5/2005 | Shishido et al. |
| 2006/0282814 A1 | 12/2006 | Percin et al. |
| 2010/0046006 A1 | 2/2010 | Mitsui |
| 2010/0166289 A1 | 7/2010 | Satake et al. |
| 2011/0292365 A1* | 12/2011 | Cramer ............ G01N 21/4785 355/67 |
| 2014/0079312 A9 | 3/2014 | Brill et al. |

FOREIGN PATENT DOCUMENTS

| | | |
|---|---|---|
| JP | 2009507230 | 2/2009 |
| JP | 2010048777 A | 3/2010 |
| JP | 2010533376 | 10/2010 |
| WO | 2006/091361 | 8/2006 |
| WO | 2007028164 | 3/2007 |
| WO | 2009/007981 | 1/2009 |
| WO | 2011104713 A1 | 9/2011 |

\* cited by examiner

METHOD AND SYSTEM FOR OPTIMIZING OPTICAL INSPECTION OF PATTERNED STRUCTURES

FIELD OF THE INVENTION

This invention is generally in the filed of optical inspection, and relates to a method and system for optimizing optical inspection of patterned structures.

BACKGROUND OF THE INVENTION

Semiconductor structures, such as integrated circuits, become more complicated in the dimensions and shapes of pattern features. Accordingly, there exists an increasing need in providing accurate measurements of full 3-dimensional structures, and in enabling these measurements to be applied to structures progressing on a production line, i.e. automatic inspection (metrology, defect detection, process control, etc.) of patterned structures.

Current metrology techniques heavily rely on test structures (which are typically produced in the scribe lines of a wafer) and on attempt to represent the process behavior inside the structure (which is not always successful). However, measuring directly the features inside the structure has a significant benefit as it allows both the relevance that test structures sometimes lack and the ability to map the changes across the structure.

Currently several metrology methods exist for the measurement of 2-dimensional (lines) and 3-dimensional structures. These methods can be roughly divided into four main groups including optical imaging techniques, beam scanning techniques, probe-based microscopy, and "non-imaging" optical techniques, usually termed scatterometry or optical critical dimension (OCD) measurement.

Optical imaging techniques are based on creation of a direct image of the region (area) of a sample. These techniques are in most cases no longer relevant for accurate geometrical measurements of such patterned structures as semiconductor wafers, because the features size of a pattern is much smaller than the wavelength used for imaging. This limitation may sometimes be overcome by utilizing aerial image of a mask taken prior to magnification down to the wafer, as done in some inspection tools (steppers).

Beam scanning techniques are based on scanning a given area of a sample with a focused beam of particles, collecting any kind of radiation produced by interaction between the beam and the sample (usually secondary particle emission), and using intensity (or other parameter) of the collected radiation to create a 2-dimensional image of the sample. Such techniques include, for example, SEM (Scanning Electron Microscopy) and Hellium Ion Beam Microscopy.

Probe-based microscopy utilizes a probe (tip) which is brought in close vicinity with the sample (such as for example in AFM—Atomic Force Microscopy) and scans a line or an area of the sample. Signals from the probe or, more often, feedback control signals (which are used to keep the probe at a constant distance from the sample) are used for creation of a 2-dimensional image of the sample.

Scatterometry or OCD techniques are based on measurement of diffraction from a repetitive structure on a sample (grating), having periodicity in either one or two directions, and reconstruction of the geometrical parameters of a unit cell of a pattern through solving the inverse problem, and fitting a model to the measurement results. Here, a measurement spot contains many periods of the repetitive structure, hence a measurement represents the average parameters across the measurement spot.

It should be noted that optical imaging techniques, beam scanning techniques and probe-based microscopy can all be implemented as scanning techniques and can create an image by scanning probe with high resolution (i.e. sensitive to a small part of the sample at a time) over the sample. As for the scatterometry or OCD techniques, they have several advantages, such as high speed and repeatability, but they usually suffer from a significant handicap which is the long setup time required before a measurement can be performed. This issue is more severe in case of 3-dimensional structures as they become more complex, because the number of parameters becomes larger and the diffraction calculation becomes longer.

One of the known approaches to circumvent the above issues is by combining information from additional sources, such as CD-SEM or AFM, for example as described in U.S. Pat. No. 6,650,424 assigned to the assignee of the present application. According to this technique scatterometry and SEM measurements are applied to a structure, and measured data indicative of, respectively, the structure parameters and lateral pattern dimensions of the structure are generated. The entire measured data are analyzed to enable using measurement results of the scatterometry for optimizing the measurement results of SEM and vice versa.

GENERAL DESCRIPTION

There is a need in the art for facilitating inspection of patterned structures, including complex structures having a complex three-dimensional pattern.

It should be understood that for the purposes of this patent application, the term "inspection" should be interpreted broadly, including measurements, metrology and/or defect detection and/or process control/monitoring, etc. Also, in the description below, "imaging" scanning techniques, such as SEM, Hellium Ion Beam Microscopy, and AFM, are referred to as a scanning technique or system or tool, or metrology technique or system or tool, and should be distinguished from "non-imaging" technique such as scatterometry or OCD.

The present invention provides for optimizing creation of an optical model for describing/interpreting OCD measured data. In this connection, it should be understood that optical models are typically used for interpretation of optical measurements. Such optical model includes one or more functional representations of a dependence of an optical response from a structure on one or more structure-related parameters/conditions and parameters/conditions of a measurement system.

The present invention optimizes the optical model creation by optimizing creation of a geometrical model of the structure under measurements (being part of structure related data), on which the optical model is based. The present invention utilizes information (measured data) from any metrology tool of the kind providing (directly or indirectly) image data or bitmap of a sample to optimize modeling of OCD measurements, which reduces the setup time for complex 3-dimensional patterned structure and provides more accurate measurements. The image data may be provided using measurements from a scanning tool (e.g. AFM, SEM, etc.). It should be noted that this optimization technique may be carried out off line or on line (real time), or a combined approach may be used.

In OCD techniques, one of the key steps is mathematical/theoretical representation of the geometry of a unit cell of a pattern in a manner that allows creation of a physical model (e.g. based on the principles of RCWA) for further interpretation of actual measured data. In most cases, the process of determination of the geometry of the unit cell is carried out during s recipe setup for each patterned layer in the structure. This is typically performed as follows: A user selects one or more unit cell geometries (geometrical models) from a given set of simple shapes (so-called "primitives"), adjusts the parameters of the selected primitive, and changes at least some of these parameters, e.g. center position and/or dimensions thereof. These steps might be repeated, if needed, until the unit cell can be sufficiently described for the physical model creation. Then, during the physical model creation/calculation based on the defined unit cell, suitable algorithms are used for performing the following: The current geometrical parameters are used to define the shape; discretization (slicing) is applied in a vertical (z) direction by slicing the features into several artificial layers, each containing a slightly different shape, and in lateral (x, y) directions; and the resulting, discretized structure is used to calculate a desired function (e.g. RCWA), such as electromagnetic response of a patterned structure, e.g. spectral response, diffraction pattern, etc.

However, the above process or similar processes currently used, suffer from the fact that the use of simple geometrical primitives does not allow to accurately describe the real geometry of the unit cell on the real structure (e.g. wafer). Additionally, the above process, apart from being in some cases time consuming, tends to produce a large set of parameters that are supposedly independent, while being in reality strongly correlated through the process behavior, e.g. size in x dimension and size in y dimension.

The present invention, according to its one aspect, provides a new approach, a so-called "hybrid approach" for optimizing OCD modeling based on data provided by imaging technique. As indicated above, an imaging tool is at times referred to herein as a scanning tool or a metrology tool. An example of the technique of the present invention is the use of data from a CD-SEM (metrology tool) for optimizing modeling of or measurements by an OCD, Scatterometry tool resulting in enhanced performance of either one or both of the metrology and CD measurements that cannot be obtained separately.

Thus, according to one broad aspect of the invention, there is provided a system for use in inspection of patterned structures, the system comprising: data input utility for receiving first type of data indicative of image data of at least a part of the patterned structure, and data processing and analyzing utility configured and operable for analyzing the image data, and determining a geometrical model for at least one feature of a pattern in said structure, and using said geometrical model for determining an optical model for second type of data indicative of optical measurements on a patterned structure.

In some embodiments of the invention, the data processing and analyzing utility comprises an identifier utility configured and operable for processing data indicative of said image data and determining a contour for at least one feature of the pattern, and a geometrical model creator utility connected to said identifier utility and operable for the determination of the geometrical model.

The data processing and analyzing utility may comprise an identifier utility configured and operable for processing the image data and identifying at least one unit cell comprising said at least one feature of the pattern, and generating said data to the contour identifier utility.

The system may also comprise a memory utility. The memory utility may serve for storing certain design rule data indicative of at least one feature of a pattern in said structure.

In some embodiments, the data processing and analyzing utility is configured and operable for receiving measured data of said second type and processing it for optimizing the first image data.

The image data may include measured data obtained by a scanning tool. The scanning tool may include a SEM and/or AFM tool.

In some embodiments, the second type of data corresponds to measured data obtainable by a scatterometry based tool.

According to another broad aspect of the invention, there is provided a measurement system comprising at least one measurement tool for obtaining measured data of at least one of the first and second types, and the above described system for the optical model creation configured for communicating with said at least one measurement tool.

According to yet another aspect of the invention, there is provided a scatterometry system comprising a measurement tool configured and operable for measuring on patterned structures and generating optical data of a second type, and the above-described system for the optical model creation.

According to yet further aspect of the invention, there is provided a method for use in inspection of patterned structures, the method comprising: receiving first type of data indicative of image data on at least a part of the patterned structure, processing and analyzing data indicative of the image data and determining a geometrical model for at least one feature of a pattern in said structure, using said geometrical model for determining an optical model for second type of data indicative of optical measurements on a patterned structure.

The determination of the geometrical model may comprise processing and analyzing data indicative of the received image data and determining a contour for at least one feature of the pattern, and processing said at least one contour for the determination of the geometrical model. The received image data may be first processed and analyzed for identifying at least one unit cell comprising said at least one feature of the pattern. To this end, certain design rule may be utilized providing data indicative of at least one feature of a pattern in said structure.

The method may operate for receiving measured data of said second type and processing it for optimizing the first image data.

The image data may include measured data obtained by a scanning tool. The latter may include SEM and/or AFM.

The second type of data may correspond to measured data obtainable by a scatterometry based tool.

The method may be used for inspection of semiconductor wafers.

According to yet another aspect of the invention, there is provided a method for use in inspection of patterned structures, the method comprising: receiving image data indicative of one or more images of at least a part of the patterned structure obtained by a scanning tool, processing and analyzing data indicative of said image data and determining a geometrical model for at least one feature of a pattern in said structure, using said geometrical model for determining an optical model for scatterometry based optical measurements on a patterned structure, thereby enabling use of said geometrical model for interpreting scatterometry based measurements applied to the patterned structure progressing on a production line.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 5 illustrates an example where correlation parameters are found off line from SEM tool data and OCD tool data, and FIG. 6 shows an example where correlation parameters are obtained during a setup stage (e.g. from SEM data) and are then used to optimize real-time measurements (e.g. OCD measured data)

DETAILED DESCRIPTION OF EMBODIMENTS

Figure 1:
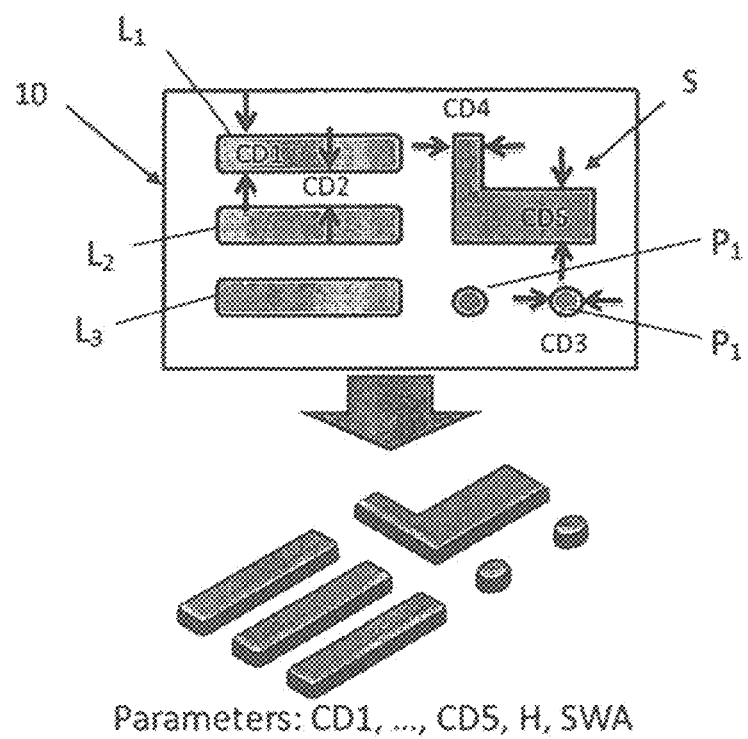
FIG. 1 is a schematic illustration of a simplified example of a unit cell suitable for OCD technique applied to patterned structures.

Reference is made to FIG. 1, illustrating a simplified example of a unit cell, generally designated 10, suitable for OCD technique applied to patterned structures. As shown, the unit cell 10 includes a pattern formed by spaced-apart features of different geometries (shapes and dimensions). In this specific but not limiting example, the features include three bars (lines) $L_1$, $L_2$ and $L_3$ characterized by the line width (critical dimension $CD_1$) and a space between the lines (critical dimension $CD_2$), two cylindrical elements (pins) $P_1$ and $P_2$ of a certain diameter (critical dimension $CD_3$), and an L-shaped feature S characterized by critical dimensions $CD_4$ and $CD_5$. It should be understood that the unit cell may have any other configuration, and the unit cell shown in the figure would practically be characterized by additional parameters, such as side wall angle (SWA), the line width profile, height, etc.

Figure 2A:
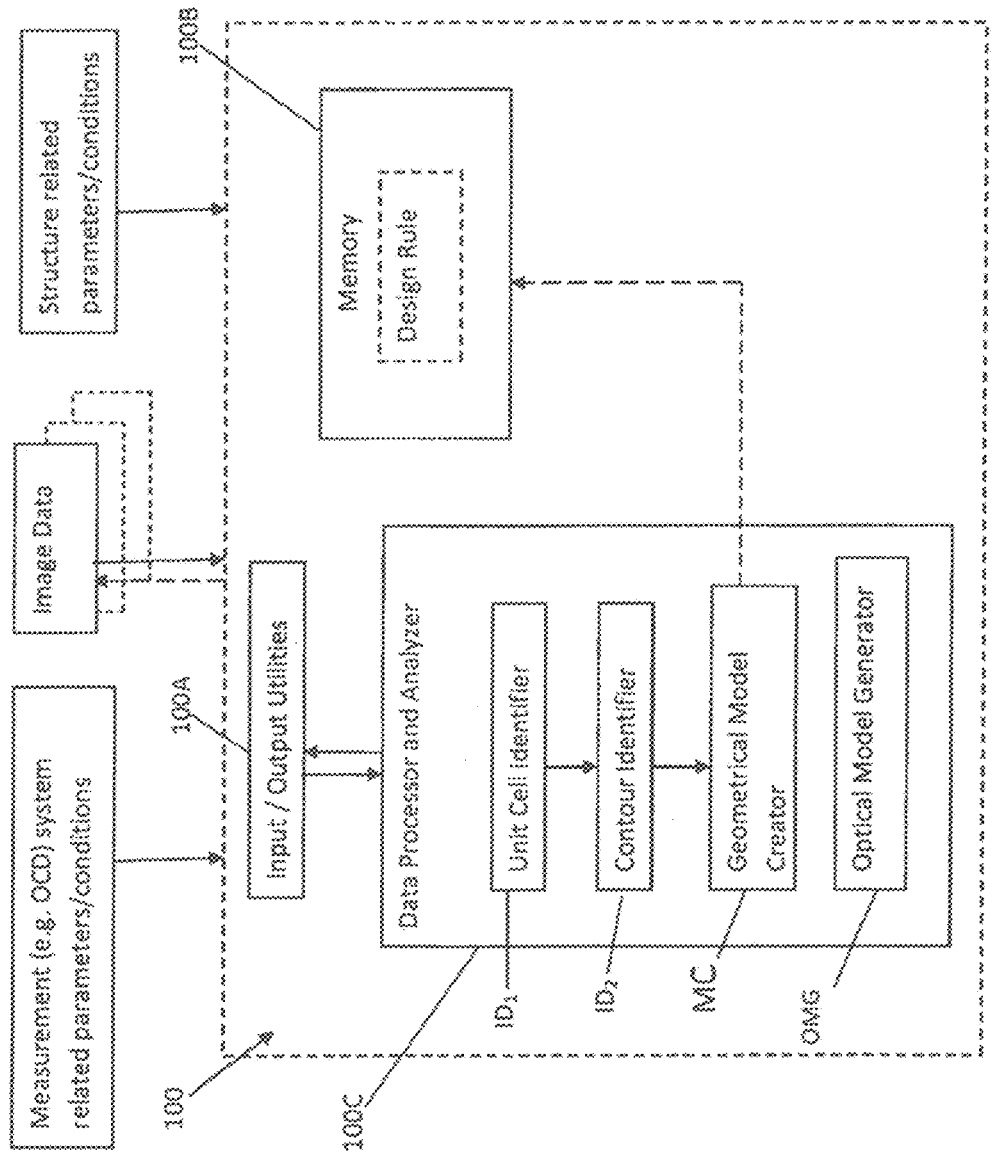
FIG. 2A exemplifies a system of the present invention for creation of an optical model for interpretation of optical measurements, e.g. OCD, on patterned structures based on image data provided by an imaging tool (metrology tool), for example SEM.
Figure 2B:
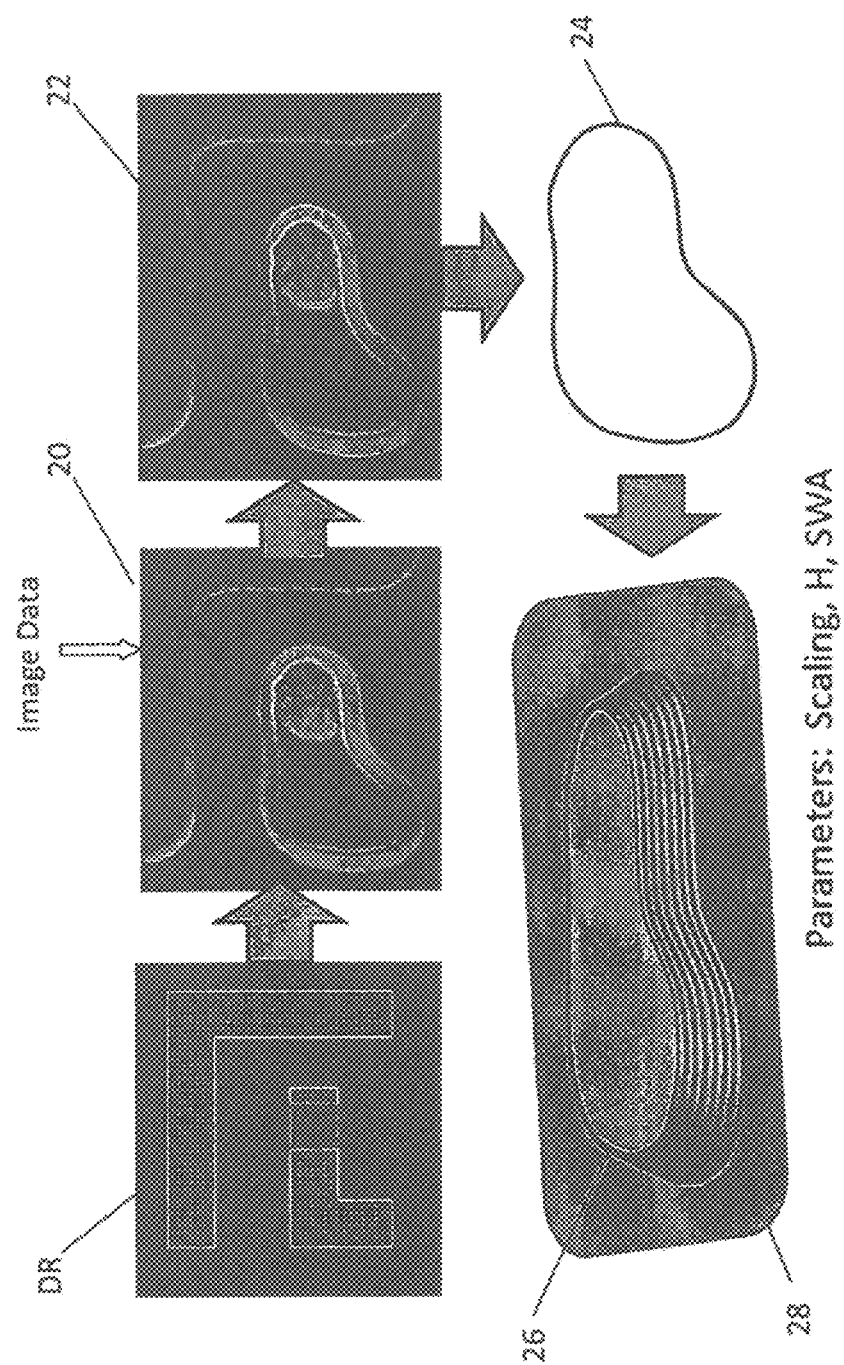
FIG. 2B exemplifies a method of the present invention for optical model creation based on identification of the unit cell from an image data obtained by a scanning tool, such as SEM.

FIGS. 2A and 2B exemplify system and method respectively of the present invention for creation of an optical model for interpretation of optical measurements on patterned structures based on image data provided by an imaging tool (metrology tool), for example SEM. This modeling process provides for utilizing image data corresponding to a 2-dimensional image obtained by the imaging tool to optimize operation of an OCD tool. It should be noted that the modeling may be carried out on line (in real time) by directly processing image data from the imaging tool, or off line utilizing image data from a storage device. As for the OCD optimization procedure, it also may be either a real-time process, as part of continuous measurement (automatic inspection) of structures progressing on a production line, or off line procedure (e.g. as part of recipe setup), or a combination of both. The simplest example of the off line mode is by using a single scanning tool image for the recipe setup of an OCD tool. The recipe setup process of such a simple example is schematically illustrated in FIG. 2B.

The process is performed by a modeling system, generally designated 100, of the invention. The system 100 is typically a computer system having inter alia data input and output utilities 100A, memory utility 100B, and data processing and analyzing utility 100C. The system may include a data presentation utility, such as display. The data input/output may be configured for receiving/transmitting data appropriately formatted for wireless communication with other devices. In this specific but not limiting example, The data processing and analyzing utility 100C includes identifier modules $ID_2$ and $ID_2$ (software and/or hardware utilities), a geometrical model creator MC (software and/or hardware utility), and an optical data generator OMG.

The identifier module $ID_2$ is preprogrammed for receiving and processing input image data and identifying unit cell(s); identifier module $ID_2$ is operable for processing the unit cell related data (received from module $ID_2$) and identifying contours for at least some of the features in the unit cell(s). The final model creator receives the contour-data and analyzes it to determine and apply a suitable morphological function and thereby create an appropriate physical model.

Thus, the system receives input image data. The latter is obtained by a scanning tool (e.g. SEM) and being indicative of a 2-dimensional image (top view) of a patterned structure or part thereof. The image data may be entered by user or received from another device (e.g. imaging tool or storage) directly or via wireless communication. The system may optionally be provided with certain design rule data DR including inter alia information about the unit cell. The system (its data processing and analyzing utility) is preprogrammed for processing the image data (while utilizing the design rule or not) for automatically identifying possible unit cells based on identified repetitions of patterned features (step 20). The case might be such that the system "suggests" several options for the unit cell, and a user chooses the correct option (i.e. a combination of automatic and manual modes for the identification of unit cell). Then, the system operates for processing image data of the unit cell for automatically identifying the contours of all or at least one of the features within the unit cell, a single such contour C being shown in the figure (step 22), and then operates to extract the contour related data/image (step 24). The system utilizes the contour related data C for determining a 3-dimensional shape 26 of the respective feature (step 28).

Optionally, the user can fine-tune the parameters of the contour detection algorithm to select a sub-set of features, e.g. in order to use only the contours related to features that reside in a specific (e.g. uppermost) layer of the patterned structure, as opposed to other features visible in the image.

The so-determined 3-dimensional shape 26 is then further processed for creating a geometrical model for further generation of the optical model for use in interpretation of OCD measurements. This process may include determination of a morphological function, which serves for imitating an effect of changing the feature (e.g. under varying process conditions) and/or a difference between the extracted contour and the real edge of the feature. The user may define parameter range(s) for the morphological function to be used for changing (stretching/shrinking) the contour during the calculation. The user may define additional geometrical parameters, e.g. structure related parameters such as side wall angle, underlying layers, etc.

Figure 3:
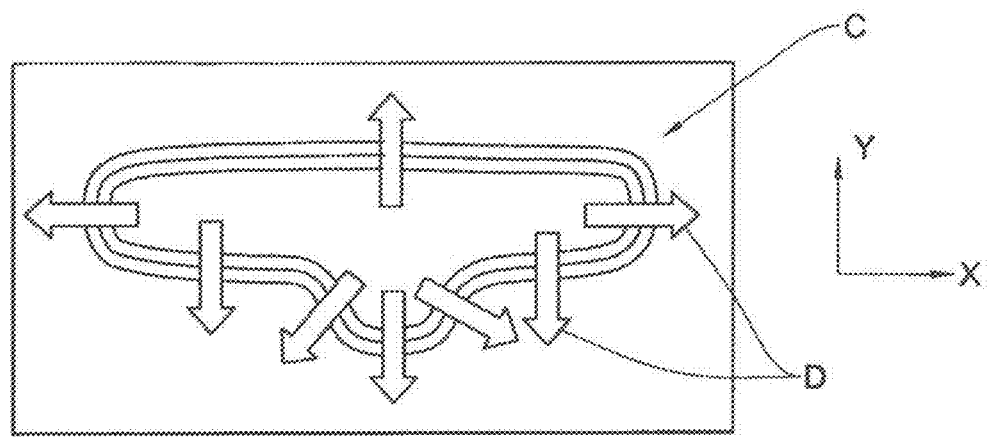
FIG. 3 exemplifies the principles of a process of stretching/shrinking the contour of a feature in the unit cell for creation of geometrical model used in the method of FIG. 2B.

A non-limiting example of the process of stretching/shrinking the contour (applying the morphological function) for the purposes of creation of geometrical model is shown in FIG. 3. In this example, the morphological function acts to stretch the contour C orthogonal to the local directions, generally at D, of the normal to the different segments of the contour. The local shift of the contour could be affected by several parameters, such as an overall average shift (overall "scaling" factor or delta-CD), the local direction of the contour (anisotropy of a parameter change, e.g. different delta-$CD_x$ and delta-$CD_y$), the local curvature of the contour (dealing differently with internal corners and external corners), etc. In most cases, the user may define only the range of the general delta-CD, while other parameters are default or already known through previously set recipes.

Another example for defining the morphological function may be as follows: One or more detection algorithms of contour identification may be applied several times on the same image data, each time with different parameters of the algorithm, e.g. threshold level values, thus obtaining a set of contours. Then, the system, being an expert system (self-learning system) is trained to find the morphological function using this set of contours.

Yet another example for finding a suitable morphological function may utilize multiple images or simulated image data pieces for the patterned structures or parts thereof having different pattern parameters corresponding to different process parameters/conditions, e.g. a lithographical process performed with different focus and exposure conditions. As a result, a set of contours is obtained from these multiple image data pieces, and the system is trained to find the morphological function. It should be noted that in this case if the images are obtained as a function of multiple process conditions, e.g. as a function of both focus and exposure, then the resulting morphological function can in turn be a function of those parameters/conditions. This property can be later used during interpretation of the actual OCD measurements (as part of the fitting process) for directly determine the process parameters/conditions from the measured data.

Turning back to FIGS. 2A and 2B, the module OMG can operate as follows to generate an appropriate optical model for use in interpretation of OCD measurements. The module OMG utilizes the geometrical model, based on the shape of the features defined by the contour, and the current value(s) of the morphological function parameters and additional parameters as described above. The module OMG is pre-programmed for simulating a diffraction signature of the determined geometrical model for given conditions (measurement system related parameters/conditions and structure related parameters/conditions), including inter alia illumination and detection channels' parameters/conditions, including but not limited to wavelengths, numerical aperture of illumination/collection, azimuth and elevation of illumination/collection, polarization of light, etc. To this end, geometrical model creator MC operates for transforming the shape of feature(s) to a discrete form, including multiple layers and discrete values for x and y; the transformation can be done using discretization in the lateral (x, y) directions. The OMG model may utilize any suitable known method (e.g. RCWA) for diffraction calculation.

The so-obtained optical model can then be used for interpreting actual measured data. This process includes a fitting (inverse problem) procedure, either using real-time-regression method or using a library method. The problem parameters include the values of the morphological function and of the additional parameters, in order to enable determination of the structure parameter(s) based on the best matching condition (based on the fitted parameters). The overall scaling factor, e.g. delta-CD, can then be correlated to measurements done by other techniques and/or to process conditions (e.g. exposure), and Statistical Process Control (SPC) charts can be used to allow process control.

It should be noted that in some cases more than one different effect cannot be optimally described by one morphological function. It would be in such case an advantage to compose several morphological functions operating successively on the contour, e.g. a function describing differences between the contour and the actual feature boundaries (correcting errors in the scanning tool and the contour detection algorithm) and another function describing the expected changes of the feature with a change in process parameters. It should also be noted that morphological transformations referred to herein as "scaling", although mathematically such transformation may or may not be pure scaling (i.e. $(x,y) \rightarrow (ax,ay)$); therefore for the purposes of the present application the term "scaling" should be interpreted broader, meaning any transformation function.

As indicated above, the invention may utilize input image data including a set of multiple images of the structure corresponding to multiple sets of process conditions, e.g. a focus-exposure matrix (FEM), used for the structure manufacture. In this case, the contour identification is performed for the entire set of images. In this case, the suitable morphological function is that which corresponds to continuous transformation of a certain reference contour to any of the other contours. The reference contour may for example be that corresponding to the process parameter or parameters' set, e.g. focus and exposure, in the middle of the predefined range for said parameter or parameters' set. In addition, scaling can be applied through an additional morphological function, as described above. This procedure advantageously provides that the parameters of the inverse diffraction problem explicitly include the process parameters. Hence, by performing a fitting of measured signals to the optical model (either by regression or using a library method), one can directly get not only the measured shape most fitting to the measured data but also the process parameters most likely to correspond to the measured data. This kind of information is specifically useful for process control as there is no need to make any additional transformation once a correction needs to be applied, i.e. deviation between the standard process parameters and the resulting process parameters directly indicate how should the process be tuned to get back to the desired feature shape and profile.

It should be noted that the sensitivity of measurements to the focus and exposure conditions may be enhanced by using specially designed targets. These may for example be targets having many sharp edges, e.g. a 2-dimensional array of diamond shapes, which shape is extremely sensitive to focus conditions as the sharp features are printing correctly only very close to optimal focus conditions. A structure consisting of many spaces that are close to the minimum space possible in a given manufacturing process may be highly sensitive to exposure conditions. Thus, combining information from several different sites containing different targets, e.g. one having high sensitivity to focus and the other having high sensitivity to exposure, more accurate information about exact full exposure conditions can be provided.

As indicated above, the present invention provides for using image(s) from a scanning tool as part of the measurement process itself (on line modeling), as well as during setup (off line modeling). The on line modeling advantageously allows for removing the concern regarding morphological changes in the contour that are not accommodated by the scaling function and for eliminating the need to fit the scaling function over a wide range. If the scaling factor has been accurately and reliably characterized during the setup procedure, then by fitting data in various process conditions, the scaling factor could then be either fixed or allowed to change in a very small window of uncertainty, thereby reducing the number of floating parameters and simplifying the fitting process during the actual measurements.

Figure 4:
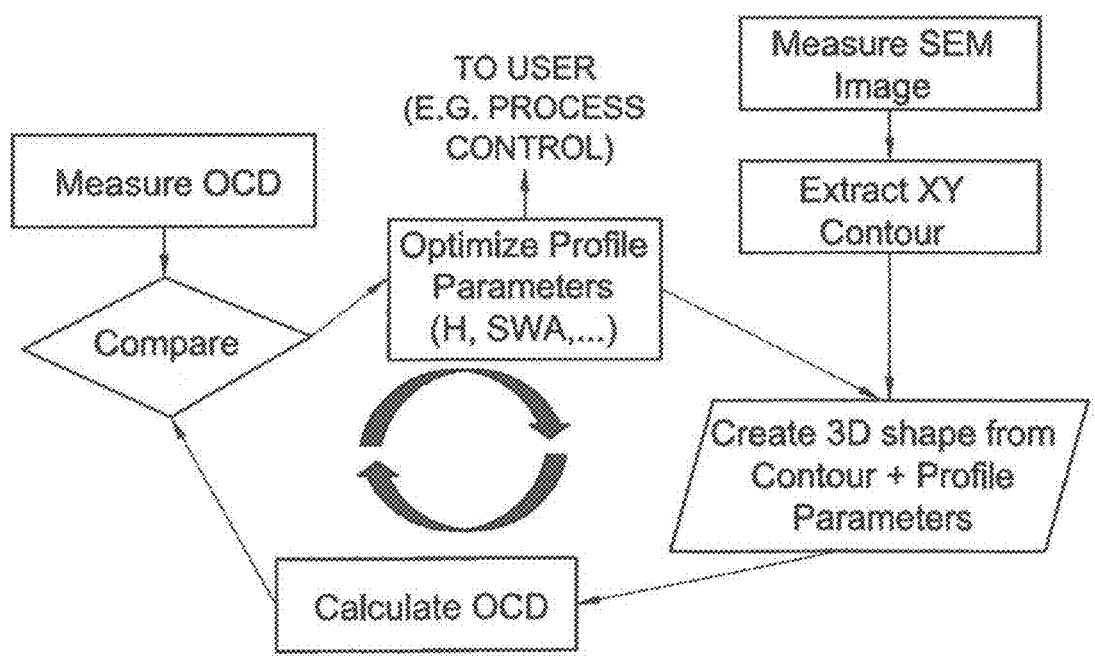
FIG. 4 exemplifies how the present invention is used for utilizing real-time OCD measurements for further optimizing the optical model previously created during an initial off line stage.

In the above-described examples, image data from a scanning tool (e.g. SEM) was used to optimize OCD measurements. As also described above, this procedure may utilize both off line modeling and on line (real time) modeling, i.e. OCD measurements (real time measurements) are used for further optimizing the model created during the initial off line stage. This is illustrated schematically, in a self-explanatory manner, in FIG. 4. As shown, measured SEM image is processed to determine the contour for each feature in the unit cell and crate a geometrical model (3-shape of at least some features of the unit cell). This data is used for generating optical model for the OCD measurements. Independently, OCD measured data is provided in real time, and interpreted by comparison with the optical model data (fitting procedure), resulting in determination of optimal structure parameters (e.g. height, SWA, etc.). These parameters are output, e.g. to user for the purposes of process control. Concurrently, these parameters are used to optimize the geometrical model and accordingly further optimize the optical model.

Figure 5:
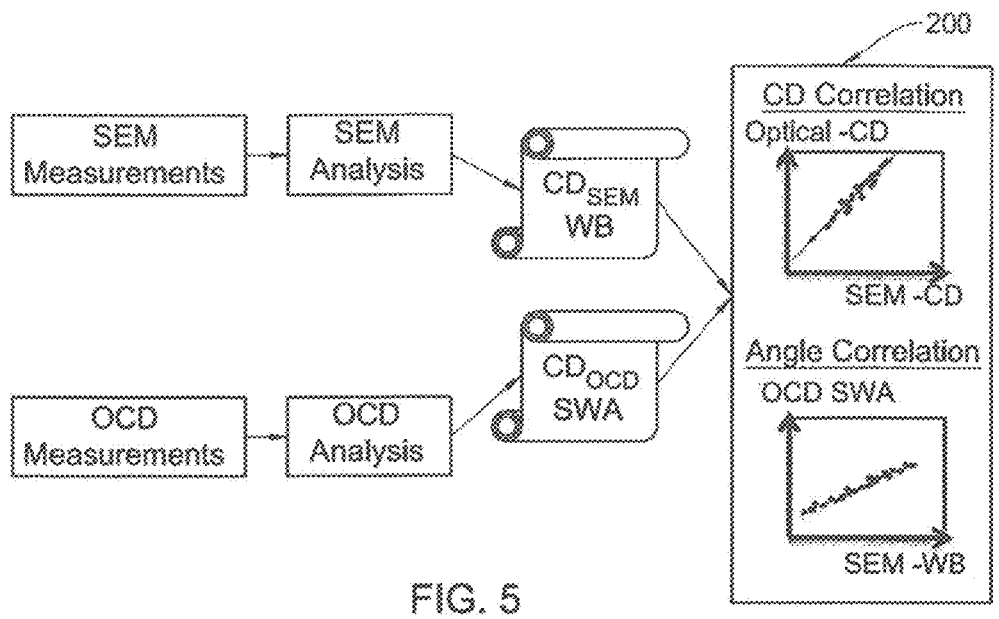
FIGS. 5 and 6 illustrate schematically how the principles of the present invention can be used for combining data from two measurement tools of different types for optimizing the optical model for use in interpretation of measured data from at least one of these tools.

The invention, in its yet other aspect, provides for combining data from two measurement tools of different types (operating on different physical principles), i.e. "imaging" and "non-imaging" types, such as respectively, CD-SEM and OCD. This is exemplified schematically in FIGS. 5 and 6. As shown in the figures, SEM and OCD tools operate independently to provide measured data pieces indicative of respectively critical dimensions ($CD_{SEM}$) and wide-band width (WB), and $CD_{OCD}$ and side wall angle (SWA). These parameters are input into a modeling (computing) system 200. The system 200 may be a computer system including inter alia data input and output utilities, memory utility, and data processing and analyzing utility, as well as data presentation utility (e.g. display). The data processing and analyzing utility in this case is configured and operable to process the input data and determine correlation curves for the critical dimensions measured by SEM and OCD tools, i.e. Optical-CD and SEM-CD, and for SB and SWA parameters, i.e. OCD-angle and SEM-WB. By this, correlation curves or correlation functions are determined, and correlation parameters, mainly slope and offset, are obtained. For example, CD values found by OCD can be correlated to CD values found by CD-SEM and Side Wall Angle values found by OCD can be correlated by White-Band width values found by CD-SEM. In order to verify correct correlation coefficients, it is best practice to perform the setup using a set of measurements representing a wide range of process conditions, e.g. for lithography process a Focus/Exposure matrix. In the example of FIG. 5, the correlation parameters are found off line, and can then be used for optimizing interpretation of OCD measurements, e.g. in case the parameter of interest, such as SWA of photoresist, is a weak parameter (i.e. parameter that affects the measured data, i.e. OCD spectra, less that other "strong" parameters.

Figure 6:
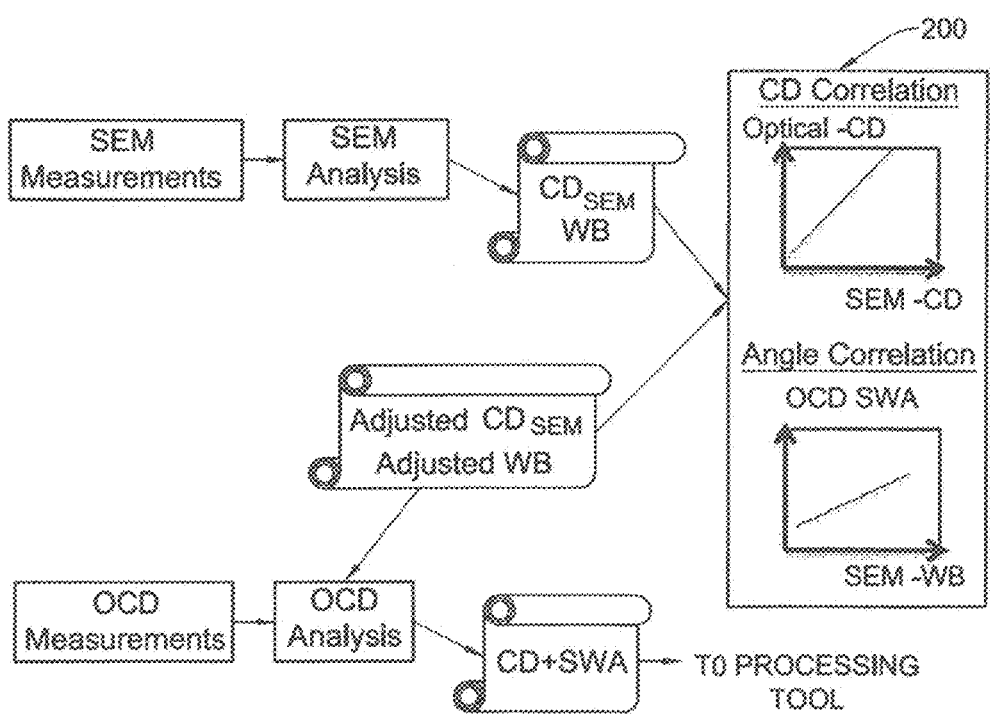

FIG. 6 shows how the correlation parameters obtained during the setup stage (FIG. 5) are used to optimize the OCD measurements, i.e. analysis of OCD measured data. As shown, correlation data is used to determine correlated or adjusted value of $CD_{SEM}$ and WB. These adjusted parameters are input into a control unit of the OCD station and used for optimizing the calculation of CD and SWA parameters.

Thus, during mass production of patterned structures such as semiconductor wafers, measurements can be taken from some or all of the sites in the structure by both OCD and SEM tools, and the measured data of one tool (e.g. the CD-SEM) can be adjusted by using correlation curves, and then the adjusted values can be used for the data interpretation process of the other tool (e.g. the OCD). By performing the above correlation and adjustment, the number of floating parameters in the second measurement can be reduced, thus enabling more stable measurement of the remaining parameters, e.g. "weak" parameters.

It should be noted that in order to reduce noise in the first measured data and thus reduce its effect on the interpretation of the second measured data, a so-called "soft injection" method can be used. This can be performed as follows: The second measurement (e.g. by OCD tool) is first performed with no prior knowledge based on the first measurement, e.g. CD-SEM. Then, an error function that might exist in the second measurement is reduced using a penalty function concept. This technique may be similar to that described in the International patent application No. PCT/IL2011/000188, assigned to the assignee of the present application, which application is incorporated herein by reference. More specifically, a penalty function is determined and added to the error function of the optimization process, favoring the measurement results to be similar to the (adjusted) values obtained from the first (CD-SEM) measurement. Such a penalty function may be for example proportional to the squared difference between the two measurements. The optimization process continues until a certain convergence condition is achieved, using a target function that includes both the original error function and the penalty function. This process advantageously provides for tuning the "strength" of the penalty function, thus reducing the amplification of noise in the first measurement on the final result.

Figure 7:
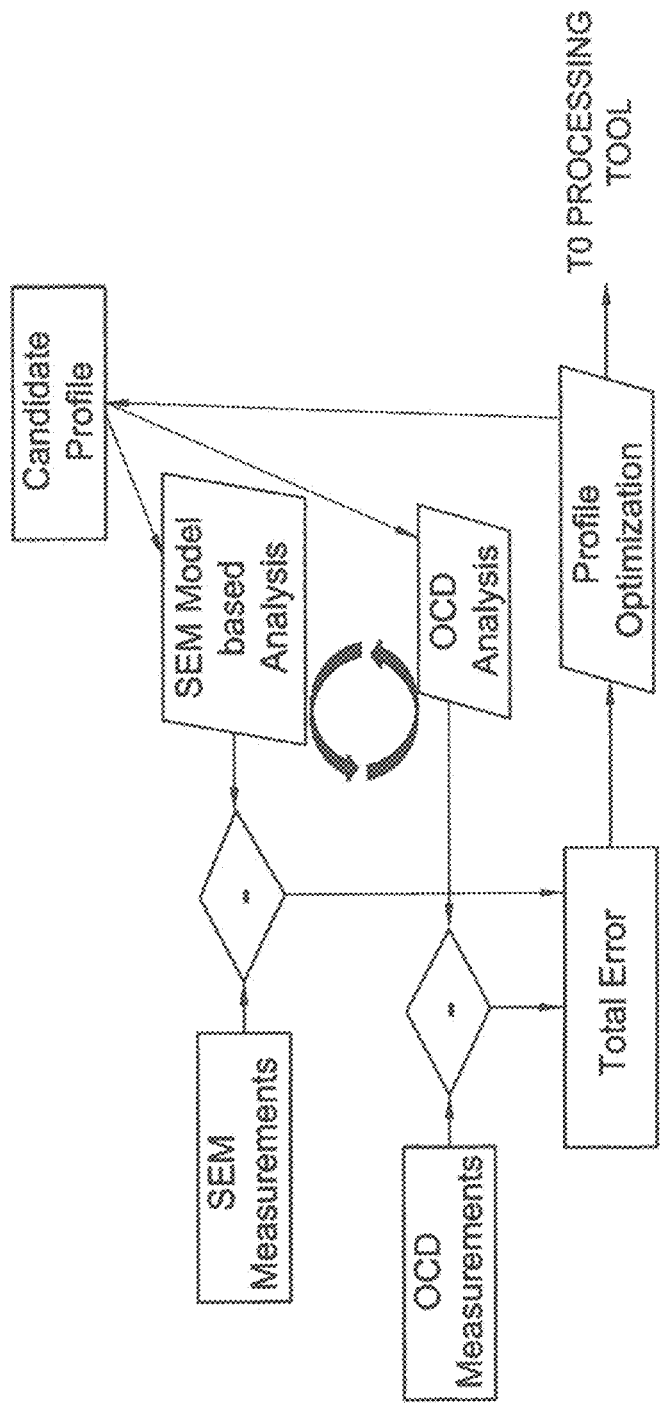
FIG. 7 exemplifies a method of the invention for jointly optimizing data interpretation models of measurement tools of different types using measured data from both of these tools, by creating a combined model for both SEM and OCD measurements.

The present invention, in its yet further aspect, provides for jointly optimizing data interpretation models of measurement tools of different types using measured data from both of these tools. This is illustrated schematically in FIG. 7. In this case, a combined model including both the SEM and OCD measurements is created. The process starts from a common "candidate profile", being certain theoretical data (knowledge, prediction) about the profile of a patterned structure, e.g. at least one feature of unit cell. The candidate profile is used for simulating the OCD data (optical response) and the SEM data (image) based on corresponding predefined models for data analysis. The so-obtained simulated OCD and SEM data are compared (by fitting) to corresponding measured data and an error is (residual error, Merit Function) determined for each measurement. The two residual errors are combined to a total error, which is minimized in a profile optimization process by iteratively adjusting the candidate profile. The profile corresponding to a minimal total error is selected to be output to the process tool or fab host, as a measurement of the profile and used for process control.

Thus, in this case, both measurement techniques (e.g. OCD and SEM) are assumed to utilize model based interpretation. The optimization is done concurrently for both measurement tools by assuming at each step of the iterative optimization process a single geometrical profile (3-D structure) and simulating the expected response for each of the tools using its own physical model. The simulated data are then compared to the measured data yielding error functions for each of the tools. The separate error functions are combined into a single Total Error figure. The optimization process is then acting to minimize the Total Error through modifying the parameters of the common geometrical profile until convergence. By combining the two (or possibly any number) channels in this way, the information that resides in each of the measurements can be fully utilized without a need to extract the results from the realm of a single physical interaction operating in one measurement tool and into the realm of another physical interaction acting in the other tool, thus avoiding potential "translation" problems.

It should be understood that running the combined interpretation using a large or sufficiently diversified set of examples enables optimization of the specific models. In the case of OCD, the model can be optimized towards a correct setting of fixed parameters, either geometric of parameters related to the optical properties of materials involved in the structure. In the case of SEM model, using the additional information obtained through the above process the model can be tuned for example with respect to the efficiency of extraction of secondary electrons from different depths, different materials, geometries, etc.

The present invention provides for combining measurements of different tools (different types of measurements) while performing the measurements on different sites of the structure. Such combination can be beneficial for various reasons. For example, it allows for increasing the overall sampling across a given wafer, as well as allows for sampling different wafers in a lot, and for measuring both inside the die, on a device, and in the scribe line on a test pattern while linking the two.

In order to be able to utilize measurements coming from different locations an additional element may be used, i.e. a model for the behavior of parameters across the wafer/die/lot. Once a model is defined, a link can be created between different measurements by penalizing results that are far away from the model (similar to the "soft injection" explained above) and the full data set, including measurements done on different locations can be re-analyzed. The whole process may be repeated until the full data set converges to minimum (stable results). Through this process information can flow between measurements done on different locations, enabling the benefits explained above.

What is claimed is:

1. A method for use in process control of the manufacture measuring of patterned structures, the method being carried out by a computer system comprising data input and output, memory and a data processing utility, the method comprising:

receiving, by the data input, a first type of measured data and a second type of measured data about a structure among the patterned structures being processed by said process, the first and second types of measured data corresponding to first and second responses of the structure measured in the first type and second type of measured data, measured by first and second measurement tools, respectively, based on different physical principles and being therefore different from one another; and processing and analyzing the first and second types of measured data by said data processing utility, comprising:

defining a combined model for measured data of both first and second types, said combined model being configured for calculation of simulated first and second responses of the structure to measurements of the first type and second type of measured data for a theoretical profile of the structure, applying the combined model to each of the received first type and second type of measured data for jointly optimizing first and second data interpretation models for interpretation of the first type measured data and the second type measured data obtainable by said first and second measurement tools; and generating output data indicative of at least one of the optimized first and second data interpretation models for use in measurements of one or more parameters of the structure being manufactured for the process control of the manufacture, wherein said processing and analyzing of the first and second types of measured data further comprises: utilizing theoretical data about the theoretical profile of the structure and said first and second interpretation models for obtaining first simulated measured data of the first type and second simulated measured data of the second type from said theoretical data about an expected profile of the structure; comparing the first simulated data with the first type of measured data, and comparing the second simulated data with the second type of measured data; determining an optimized pattern profile based on the comparing; and using said optimized pattern profile for said jointly optimizing of the at least one of said first and second data interpretation models, and wherein said comparing of the simulated data comprises determining first and second errors between the first simulated and measured data and the second simulated and measured data, respectively; combining the first and second errors into a total error which is minimized in said jointly optimizing of the at least one of said first and second data interpretation models.

2. A method according to claim 1, wherein said second type measured data comprises scatterometric data.

3. A method according to claim 1, wherein said first type measured data comprises image data.

4. A method according to claim 2, wherein said first type measured data comprises image data.

5. A method according to claim 2, wherein said scatterometry data comprises optical response data indicative of a profile of the pattern.

6. A method according to claim 5, wherein said scatterometry data comprises Optical Critical Dimension (OCD) data.

7. A method according to claim 1, wherein said processing and analyzing of the first and second types measured data further comprises determining a correlation function between the first and second types measured data, and utilizing said correlation function for optimizing of the at least one of the first and second data interpretation models.

8. A method according to claim 1, wherein said jointly optimizing of the first and second data interpretation models comprises: performing a fitting process between the measured data and the simulated data for optimizing the theoretical data about the profile of the structure.

9. A method according to claim 1, wherein the first measured data is obtained from at least one of Scanning Electron Microscopy (SEM) or Atomic Force Microscopy (AFM).

10. A method according to claim 1, wherein the first measured data is indicative of one or more of the following pattern parameters: side wall angle (SWA), a line width profile, height.

11. A method according to claim 1, wherein said optimizing of the data interpretation model comprises setting of at least one model parameters comprising a parameter related to optical properties of materials in the structure.

12. A method according to claim 1, wherein the first data interpretation model comprises parameters characterizing extraction of secondary charge carriers from different regions of the structure comprising at least one of different depths, different materials and different geometries.

13. A method according to claim 8, wherein the error is determined as a residual error or a Merit Function.

14. A computer system for carrying out the method of claim 1, the system comprising:
- a data input utility for receiving said different first and second types measured data corresponding to the first and second responses of the structure measured in the first type and second type measurements by the first and second measurement tools, respectively;
- a memory utility; and
- a data processing and analyzing utility configured and operable for to perform the processing and analyzing of the first and second types of measure data.

15. The method of claim 1, further comprising, before said step of receiving, measuring the first type and second type of data about the structure being processed.

16. The method of claim 15, further comprising using the output data for process control of the manufacture.

17. The method of claim 1, further comprising using the output data for process control of the manufacture.

* * * * *